United States Patent
Lupetini

(10) Patent No.: US 8,458,116 B2
(45) Date of Patent: Jun. 4, 2013

(54) GENERATING A POWER MODEL FOR AN ELECTRONIC DEVICE

(75) Inventor: Maria Lupetini, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 825 days.

(21) Appl. No.: 12/613,055

(22) Filed: Nov. 5, 2009

(65) Prior Publication Data

US 2011/0106286 A1    May 5, 2011

(51) Int. Cl.
G06F 17/50    (2006.01)

(52) U.S. Cl.
CPC .................................. *G06F 17/5009* (2013.01)
USPC .................. 706/54; 706/12; 703/13; 716/109

(58) Field of Classification Search
USPC .............................................. 706/12; 716/109
See application file for complete search history.

(56) References Cited

U.S. PATENT DOCUMENTS

| | | | |
|---|---|---|---|
| 5,424,942 A | 6/1995 | Dong et al. | |
| 5,535,370 A * | 7/1996 | Raman et al. | 703/15 |
| 6,090,151 A * | 7/2000 | Gehman et al. | 716/108 |
| 6,338,025 B1 * | 1/2002 | Bowen et al. | 702/60 |
| 6,519,552 B1 | 2/2003 | Sampath et al. | |
| 6,625,785 B2 | 9/2003 | Chatterjee et al. | |
| 7,490,030 B2 * | 2/2009 | Burton et al. | 703/18 |
| 7,552,410 B1 * | 6/2009 | Chirania | 716/109 |
| 8,146,035 B1 * | 3/2012 | Schumacher et al. | 716/109 |
| 2007/0040582 A1 | 2/2007 | Gross et al. | |
| 2007/0115939 A1 * | 5/2007 | Lee et al. | 370/352 |

OTHER PUBLICATIONS

Simunic, Tajana et al.; "Dynamic Power Management for Portable Systems"; 2000; ACM; MOBICOM 2000; pp. 11-19.*
Benini, Luca et al.; "A Survey of Design Tecniques for System-Level Dynamic Power Management"; 2000; IEEE Transactions on Very Large Scale Integration (VLSI) Systems, vol. 8, No. 3; pp. 299-316.*
Simunic, Tajana; "Dynamic Management of Power Consumption"; 2002; Power Aware Computing; pp. 1-24.*
Benini, Luca et al.; "Policy Optimization for Dynamic Power Management"; 1999; IEEE Transactions on Computer-Aided Design of Integrated Circuits and Systems, vol. 18, No. 6; pp. 813-833.*
Cao, Lipeng; "Circuit Power Estimation Using Pattern Recognition Techniques"; 2002; IEEE; pp. 412-417.*
Eiermann, Michael et al.; "Novel Modeling Techniques for RTL Power Estimation"; 2002; ACM; ISLPED '02; pp. 323-328.*

(Continued)

*Primary Examiner* — David R Vincent
*Assistant Examiner* — Stanley K Hill
(74) *Attorney, Agent, or Firm* — Sam Talpalatsky; Nicholas J. Pauley; Joseph Agusta

(57) ABSTRACT

An apparatus that generates a power model for an electronic device, an apparatus that operates in accordance with a generated power model, and methods for generating a power for an electronic device are disclosed. In a particular embodiment, a method of generating a power model for the electronic device includes reducing training data to identify a subset of operating parameters of an electronic device that contribute most to power consumption of the electronic device and generating the power model for the electronic device based on the reduced training data. The power model is operative to predict a power consumption value corresponding to the electronic device responsive to a set of operating parameter values corresponding to operation of the electronic device.

37 Claims, 12 Drawing Sheets

OTHER PUBLICATIONS

Hsieh, Wen-Tsan et al.; "A Novel Approach for High-Level Power Modeling of Sequential Circuits Using Recurrent Neural Networks"; IEEE; pp. 3591-3594.*

Cheng, Shunfeng et al. "Multivariate State Estimation Techniques for Remaining Useful Life Prediction of Electronic Products," Center for Advanced Life Cycle Engineering (CALCE), University of Maryland, College Park, MD, 2007, 7 pages.

Ahuja S., et al., "Accurate power estimation of hardware co-processors using system level simulation", Proceedings of The 2009 International SOC Conference (SOCC 09), Sep. 9, 2009, pp. 399-402, XP031618444.

Anonymous, "Multivariate adaptive regression splines", Wikipedia, Apr. 20, 2009, pp. 1-6, XP002623334, Retrieved from the Internet, URL: http,//en.wikipedia.org/w/index.php"title=Multvariate_adaptive_regression_splines&oldid =285071396 [retrieved on Feb. 15, 2011] sections 5-7.

Bogliolo A., L, et al., "Regression-based RTL power modeling", ACM Transactions on Design Automation of Electronic Systems, vol. 5. No. 3, Jul. 2000, pp. 337-372, XP040114797, section 2.1, penultimate paragraph, figure 3, section 3.1.

Hsieh C. T., et al., "Statistical sampling and regression analysis for RT-Level power evaluation", Digest of Technical Papers From the 1996 IEEE/ACM International Conference on Computer-Aided Design (ICCAD 96), Nov. 10, 1996, pp. 583-588, XP010205437, section 6.2.

International Search Report and Written Opinion—PCT/US2010/055692, International Search Authority—European Patent Office—Mar. 2, 2011.

Lee S. E., et al., "Design and analysis of on-chip interconnection network for multi-processor system-on-chip", 2008, University of California, XP007917251, ISBN: 9780549582110.

Pasricha S., et al., "COMMSYN: On-chip communication architecture synthesis for multi-processor system-on-chip", 2008, University of California, XP007917252, ISBN: 9780549682110.

Senguttuvan R, "Low-cost test, diagnosis and tuning for adaptive radio frequency systems", May 2008, Georgia Institute of Technology, XP007917246, ISBN: 9780549558736.

Zhang C., et al., "On-line calibration and power optimization of RF systems using a built-in detector", Proceedings of The 27th IEEE VLSI Test Symposium (VTS 09), May 3, 2009, pp. 285-290, XP31478890, section II, penultimate paragraph, section III.

Francis, Louise. "Martian Chronicles: Is MARS better than Neural Networks", http://www.salfordsystems.com/doc/03wf027.pdf, 37 pages.

Uysal, Ilhan et al., "An overview of regression techniques for knowledge discovery," The Knowledge Engineering Review, 1999, pp. 319-340, vol. 14:4, Cambridge University Press, UK.

* cited by examiner

GENERATING A POWER MODEL FOR AN ELECTRONIC DEVICE

I. FIELD

The present disclosure is generally related to generating a power model for an electronic device.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Each of these portable personal computing devices may include a variety of different electronic devices all of which consume some amount of power.

Examples of such electronic devices include processor cores, interface devices, interface buses, and the like. Managing power consumption of the electronic devices may prolong battery life in the portable personal computing device and increase efficiency. One way to manage power consumption of an electronic device is through use of a power model that predicts power consumption of the electronic device based on operating parameter values. It is desirable to increase the accuracy and precision of power models for electronic devices to more accurately and precisely predict power consumption of the electronic devices.

III. SUMMARY

A power model that predicts power consumption of an electronic device, such as a processor core or an electrical interface, is disclosed. The power model may be generated by performing a multivariate adaptive regression splines analysis operation on previously collected training data. The training data includes values of power consumption of the electronic device recorded at various operating parameter settings of the electronic device. In some electronic devices, many different operating parameters may affect power consumption of the electronic device to some extent. However, some operating parameters may influence overall power consumption of the electronic device more than others. Often, one operating parameter's influence on power consumption affects other operating parameter's influence on power consumption. The multivariate adaptive regression splines analysis operation reduces the training data to identify factors that contribute most to the power consumption of the electronic device. That is, in a particular embodiment the multivariate adaptive regression splines analysis reduces the training data by removing entire factors considered in generating the power model rather than by removing observations of factors.

In a particular embodiment, an apparatus is disclosed that includes a processor configured to reduce training data to identify a subset of operating parameters of an electronic device that contribute most to power consumption of the electronic device. The processor is also configured to generate a power model for the electronic device based on the reduced training data. The power model is operative to predict a power consumption value corresponding to the electronic device responsive to a set of operating parameter values corresponding to operation of the electronic device. In one particular embodiment, the power model is generated with a multivariate adaptive regression splines operation.

In another particular embodiment, a method of generating a power model for an electronic device is disclosed. The method includes reducing training data to identify a subset of operating parameters of an electronic device that contribute most to power consumption of the electronic device. The method also includes generating the power model for the electronic device based on the reduced training data. The power model is operative to predict a power consumption value responsive to a set of operating parameter values corresponding to operation of the electronic device.

In another particular embodiment, an electronic device that includes a power management circuit is disclosed. The power management circuit is responsive to a power model generated with a multivariate adaptive regression splines operation. The power model is operative to predict a power consumption value responsive to a set of operating parameter values corresponding to operation of the electronic device.

In another particular embodiment, a first electronic device and a second electronic device are disclosed. The first electronic device includes a power management circuit responsive to a power model generated with a multivariate adaptive regression splines operation. The power model is operative to predict a power consumption value corresponding to a second electronic device responsive to a set of operating parameter values corresponding to operation of the second electronic device.

In another particular embodiment, a processor is disclosed. The processor includes one or more operating parameter values that are set in accordance with a power model. The power model predicts power consumption of the processor based on values of a plurality of operating parameters excluding a processor on-chip memory access parameter and excluding a processor instruction branching performance parameter.

In another particular embodiment, an electrical interface is disclosed. The electrical interface includes one or more operating parameter values that are set in accordance with a power model. The power model predicts power consumption of the electrical interface based on values of a plurality of operating parameters excluding a parameter indicating a number of masters communicating via the electrical interface, a parameter indicating a number of slaves communicating via the electrical interface, and a parameter indicating burst length of data communications via the electrical interface.

One particular advantage provided by at least one of the disclosed embodiments is to increase the accuracy and precision of a power model for an electronic device and to increase the accuracy and precision of predictions by the power model of power consumption by the electronic device. Another particular advantage provided by at least one of the disclosed embodiments is to identify the operating parameters of an electronic device that contribute most to power consumption of the electronic device.

IV. BRIEF DESCRIPTION OF THE DRAWINGS

Figure 11:
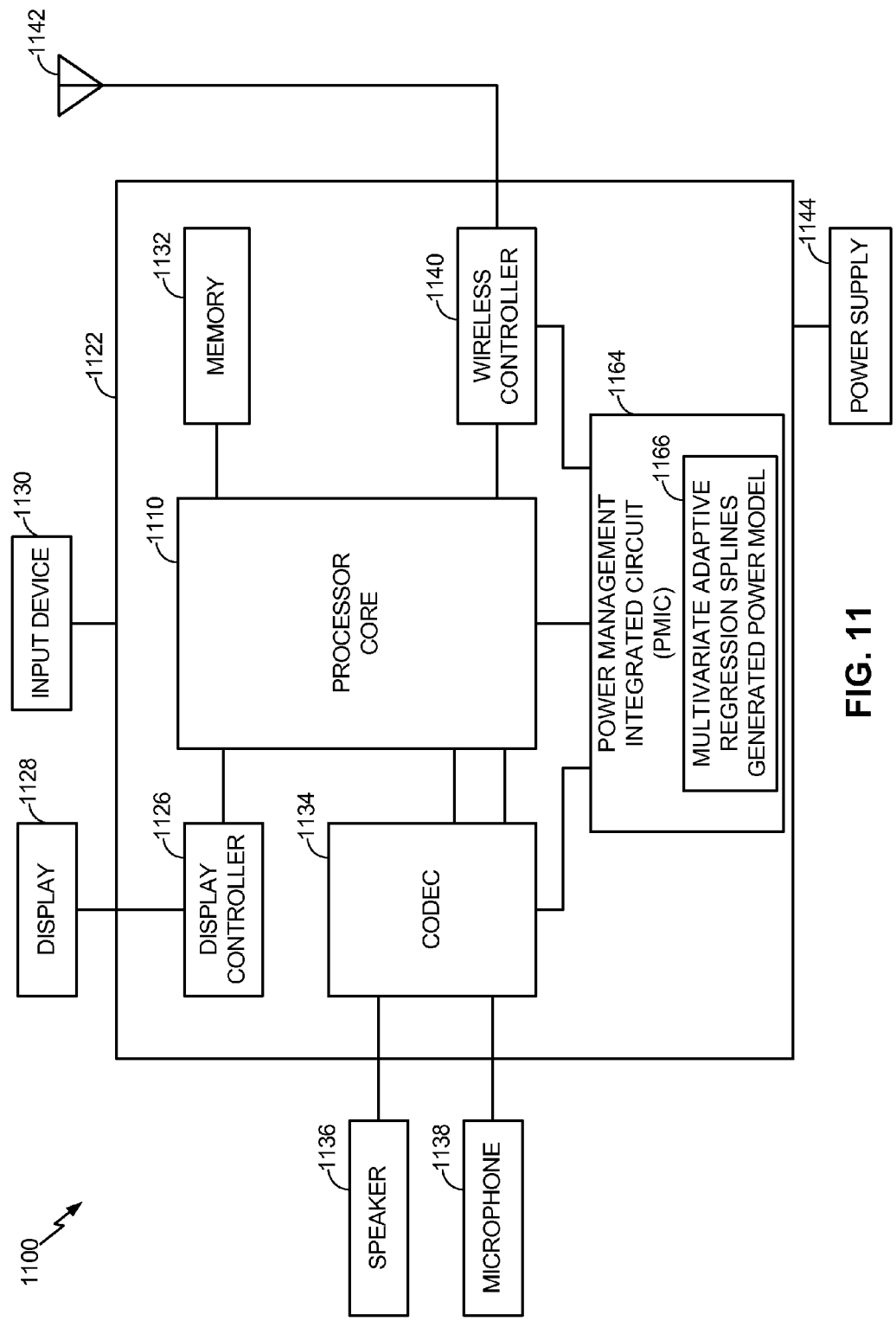
Figure 12:
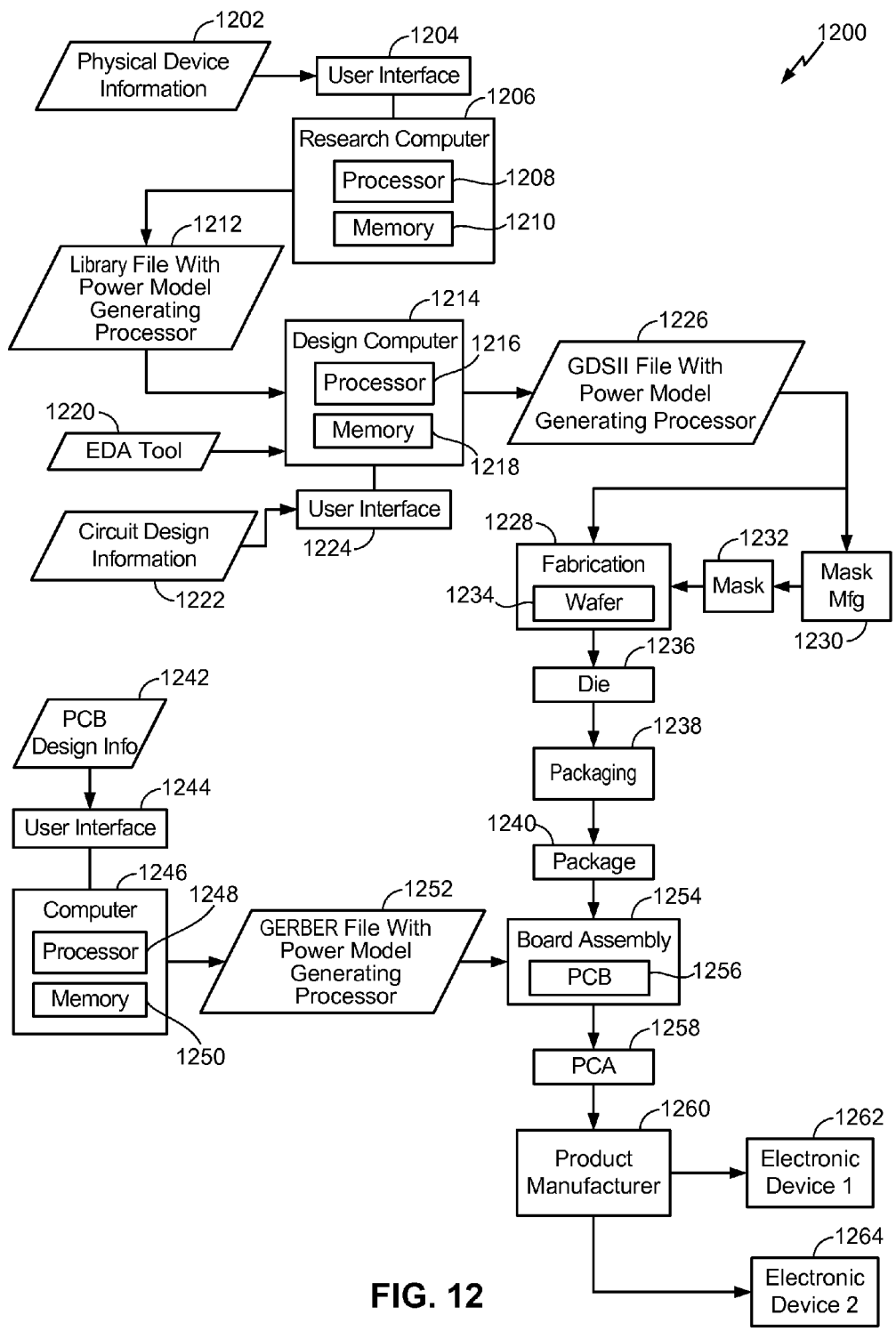

FIG. 11 is a block diagram of a third particular embodiment of a system including a power management circuit that is responsive to a power model generated with a multivariate adaptive regression splines operation; and FIG. 12 is a data flow diagram illustrating a manufacturing process for use with a power model generating processor that reduces training data to identify operating parameters contributing most to power consumption of an electronic device and generates a power model for the electronic device based on the reduced training data.

V. DETAILED DESCRIPTION

Figure 1:
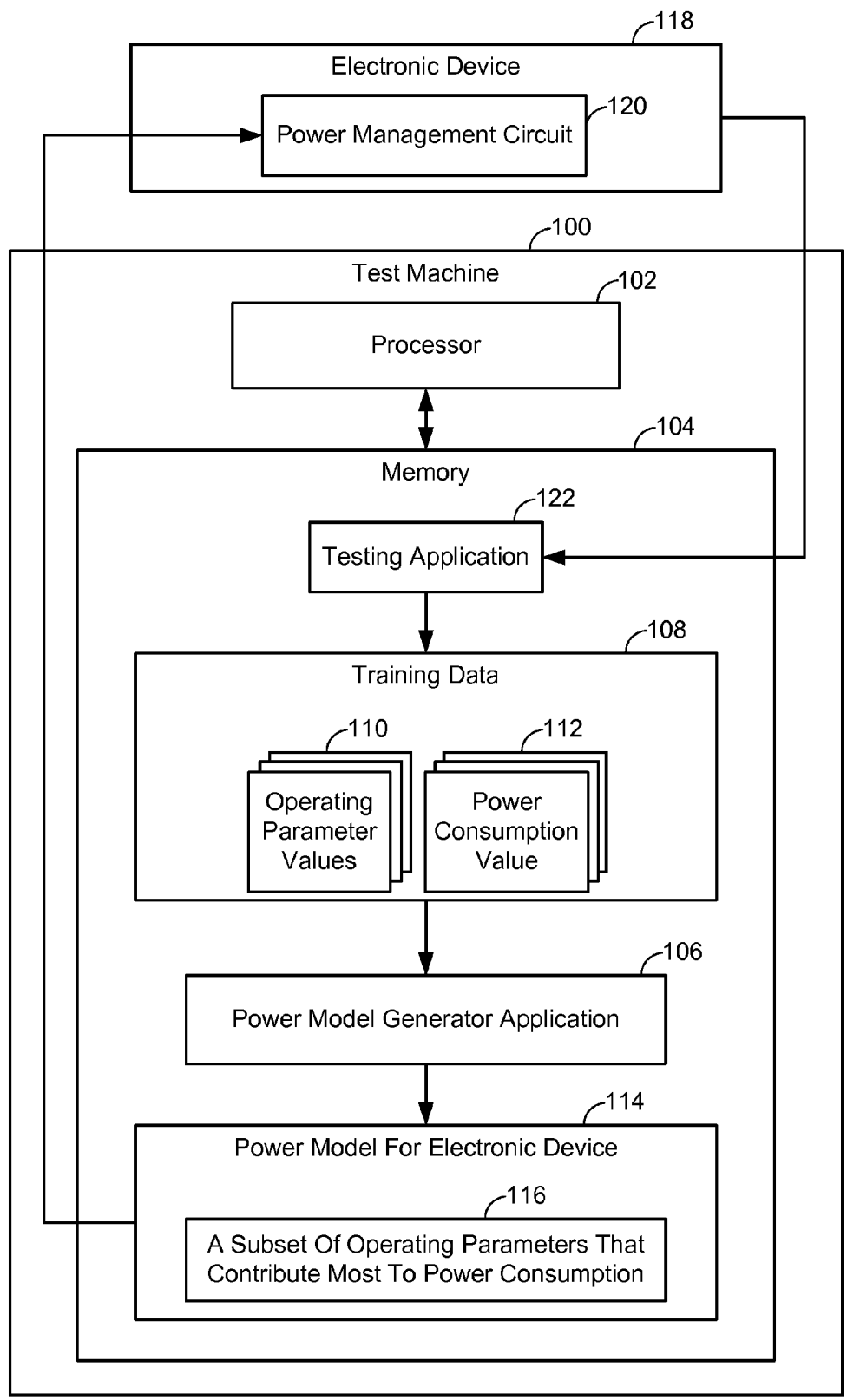
FIG. 1 is a block diagram of a first illustrative embodiment of a system to generate a power model for an electronic device.

Referring to FIG. 1, a first embodiment of a system that generates a power model 114 for an electronic device 118 is depicted. The system of FIG. 1 includes a test machine 100 coupled to the electronic device 118. The electronic device 118 includes a power management circuit 120. The test machine 100 includes a processor 102 coupled to a memory device 104. The test machine 100 of FIG. 1 generates the power model 114 for the electronic device 118 at least in part by reducing training data 108 to identify a subset 116 of operating parameters of the electronic device 118 that contribute most to power consumption of the electronic device 118. That is, in a particular embodiment the test machine 100 reduces the training data 108 by removing entire factors considered in generating a power model of the electronic device rather than by removing observations of such factors. Operating parameters of an electronic device that "contribute most" to power consumption of the electronic device are operating parameters having values that cause changes in power consumption of the electronic device greater than other operating parameters. The effect on power consumption by an operating parameter may be directly related to the operating parameter (e.g., increasing clock speed increases power consumption of a processor core), or may indirectly affect power consumption by reducing or increasing the influence of another operating parameter. In a particular embodiment the power model 114 is generated with by performing a multivariate adaptive regression splines operation, as is described below in greater detail with respect to FIG. 2.

The electronic device 118 may be any electronic device including, for example, a processor, an electrical interface, or other device. A power management circuit 120 of the electronic device 118 may be configured to manage power consumption of the electronic device 118 in real-time or near real-time during operation of the electronic device 118 by altering operating parameter values of the electronic device 118.

The processor 102 of the test machine 100 is configured to execute computer program instructions stored in the memory device 104 or stored in another computer-readable medium, such as an optical storage medium. As illustrated, the processor 102 executes a testing application 122 that collects training data 108 and executes a power model generator application 106 that generates the power model 114 for the electronic device 118.

As illustrated, the testing application 122, when executed by the processor 102, may collect training data 108 from the electronic device 118. The training data 108 includes operating parameter values 110 and corresponding power consumption values 112 of the electronic device 118. The testing application 122 may collect the training data 108 by specifying a set of operating parameter values 110 for the electronic device 118 and acquiring a corresponding power consumption value 112 during operation of electronic device 118 iteratively, for a predefined number of sets of operating parameter values 110. The testing application 122 is but one way among many possible ways in which the test machine 100 may collect the training data 108 from the electronic device 118. For example, the test machine 100 may receive the training data 108 as a file from a previous test of the electronic device 118 carried out as described above.

The power model generator application 106, when executed by the processor 102, reduces the training data 108 to identify the subset 116 of operating parameters of the electronic device 118 that contribute most to power consumption of the electronic device 118. In a particular embodiment, the reduction of the training data 108 by the executed power model generator application 106 is carried out automatically without user intervention. The power model generator application 106 when executed by the processor 102 also generates the power model 114 for the electronic device 118 based on the reduced training data 108. The power model 114 for the electronic device 118 is operative to predict a power consumption value corresponding to the electronic device 118 responsive to a set of operating parameter values corresponding to operation of the electronic device 118.

In operation, the processor 102 may execute the testing application 122 to collect the training data 108 from the electronic device 118. The processor 102 may then execute the power model generator application 106 to reduce the training data 108 to identify the subset 116 of operating parameters of the electronic device 118 that contribute most to the power consumption of the electronic device 118. The processor 102 may continue execution of the power model generator application 106 to generate the power model 114 for the electronic device 118 based on the reduced training data 108. The generated power model 114 for the electronic device 118 is operative to predict a power consumption value corresponding to the electronic device 118 when provided with a set of operating parameter values 110 corresponding to operation of the electronic device 118. The test machine 100 may then provide the power model 114 to the power management circuit 120 of the electronic device 118. The power management circuit 120 may use the power model 114 to manage power consumption of the electronic device 118 in real-time during operation of the electronic device 118.

Reducing the training data 108 enables the test machine 100 to identify the operating parameters contributing most to power consumption in the electronic device 118 and to generate a power model using the operating parameters determined to be most influential to power consumption, rather than generating a power model with operating parameters that are simply assumed to contribute to the power consumption of the electronic device 118. In at least some cases, operating parameters assumed to contribute most to the power consumption of the electronic device 118 may not be operating parameters that do, in fact, contribute most to the power consumption of the electronic device 118. In addition, because the reduction in the training data 108 is carried out automatically, without user intervention, the test machine 100 may reduce a large amount of training data 108 and greatly increase the accuracy and precision of the generated power model 114 for the electronic device 118.

Figure 2:
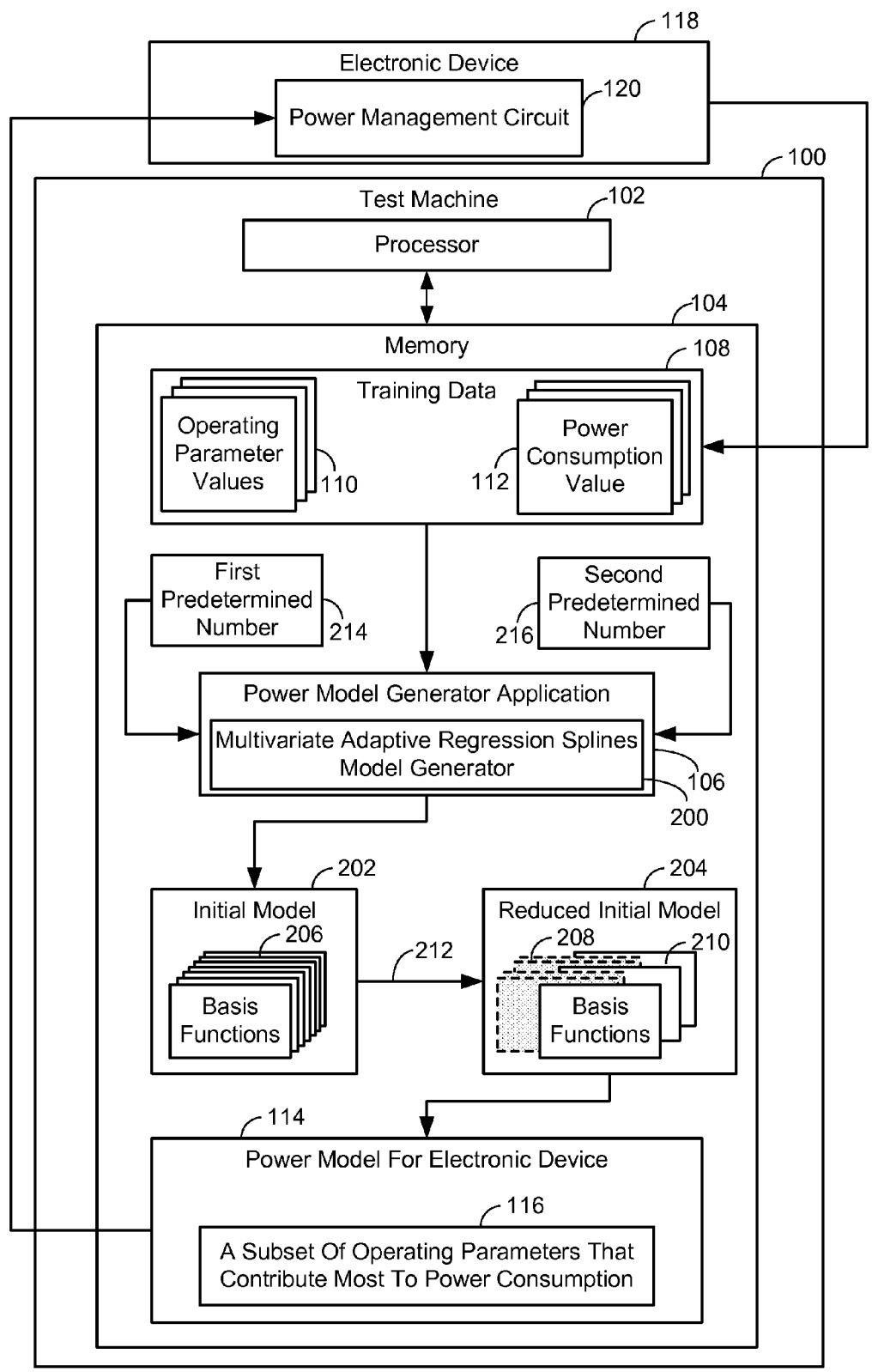
FIG. 2 is a block diagram of a second illustrative embodiment of a system to generate a power model for an electronic device.

Referring to FIG. 2, a second embodiment of a system that generates a power model 114 for an electronic device 118 is depicted. The system of FIG. 2 includes a test machine 100 coupled to the electronic device 118. The electronic device 118 includes a power management circuit 120 that manages power consumption of the electronic device 118 according to the power model 114. The test machine 100 includes a processor 102 coupled to a memory device 104. The test machine 100 of FIG. 2 generates the power model 114 for the electronic device 118 at least in part by reducing training data 108 to identify a subset 116 of operating parameters of the electronic device 118 that contribute most to power consumption of the electronic device 118.

As illustrated, the processor 102 of the test machine 100 is configured to execute computer program instructions stored in the memory device 104 or stored in another computer-readable medium. As illustrated, the processor 102 executes a power model generator application 106 that reduces training data 108 to identify a subset 116 of operating parameters of the electronic device 118 that contribute most to power consumption of the electronic device 118. The power model generator application 106 is also executable to generate the power model 114 for the electronic device 118 based on the reduced training data 108.

In a particular embodiment, the power model generator 106 includes a multivariate adaptive regression splines model generator 200. The multivariate adaptive regression splines model generator 200 reduces the training data 108 and generates the power model 114 for the electronic device 118 through application of a multivariate adaptive regression splines analysis of the training data 108. Multivariate adaptive regression splines analysis is a non-parametric regression technique that operates as an extension of linear models to automatically model non-linearities and interactions. The multivariate adaptive regression splines model generator 200 may build models in the form of:

$$f(x) = \sum_{i=1}^{k} c_i B_i(x),$$

where $f(x)$ is the model, $B_i(x)$, is a basis function, $c_i$ is a constant coefficient, and k is an integer. Each basis function $B_i(x)$ in the multivariate adaptive regression splines model may take one of the following forms: a constant, a hinge function, or a product of two or more hinge functions. A hinge function in a multivariate adaptive regression splines model has the form max(0,x-const) or max(0,const-x) where x is a variable and const is a constant called a knot.

As illustrated, the power model generator application 106, when executed by the processor 102, may reduce the training data 108 to identify the subset 116 of operating parameters of the electronic device 118 that contribute most to power consumption of the electronic device 118 in part by generating an initial model 202 based on the training data 108. The initial model 202 includes a number of basis functions 206. Each of the basis function 206 corresponds to an operating parameter of the electronic device 118.

The power model generator application 106, when executed by the processor 102, may generate the initial model 202 in a number of iterations corresponding to a first predetermined number 214 of basis functions 206 to include in the initial model 202. The power model generator application 106, in iteratively generating the initial model 202, may select a basis function 206 to add to the initial model 202 to maximize a goodness-of-fit value of the initial model 202 with respect to the training data 108 and may add the selected basis function to the initial model 202. In a particular embodiment the first basis function selected to add to initial model 202 is a constant basis function. In a particular embodiment, the power model generator application 106 may employ a generalized cross validation (GCV) algorithm to maximize the goodness-of-fit value of the initial model 202 with respect to the training data 108 when selecting a basis function to add to the initial model 202.

The first predetermined number 214 of basis functions, and therefore the number of iterations carried out in generating the initial model 202, may be a user defined value. Reducing the number of basis functions 206 to include in the initial model 202 may reduce time and processing capabilities spent in generating the initial model 202 and in reducing the training data 108 and generating the power model 116 for the electronic device 118.

The power model generator application 106, when executed by the processor 102, may also reduce the initial model 202 by iteratively removing one or more of the basis functions 206 from the initial model 202. The reduced initial model 204 in FIG. 2 is illustrated with shaded, iteratively removed basis functions 208 and remaining basis functions 210. The remaining basis functions 210 may correspond to operating parameters contributing most to the power consumption of the electronic device 118.

In a particular embodiment, the power model generator application 106 may reduce the initial model 202 iteratively within a second predetermined number 216 of iterations. The second predetermined number 216 of iterations may be a user defined value corresponding to a maximum number of operating parameters to identify as the operating parameters contributing most to the power consumption of the electronic device. That is, in a particular environment a user may select the maximum number of operating parameters for the power model generator application 106 to identify as operating parameters contributing most to power consumption of the electronic device 118. Limiting the number of the operating parameters to identify as operating parameters contributing most to the power consumption of the electronic device 118 may reduce time and processing overhead for the power model generator application 106 in reducing the training the data 108 and in generating the power model 114 for the electronic device 118. Further, limiting the number of the operating parameters to identify as operating parameters contributing most to the power consumption of the electronic device 118 may also reduce the complexity of the power model 114 generated by the electronic device such that the power management circuit 120 of the electronic device 118 may manage power consumption of the electronic device in accordance with the power model 116 using fewer processing resources and requiring less state information of the electronic device 118 than by using a power model including a greater number of operating parameters.

Figure 3:
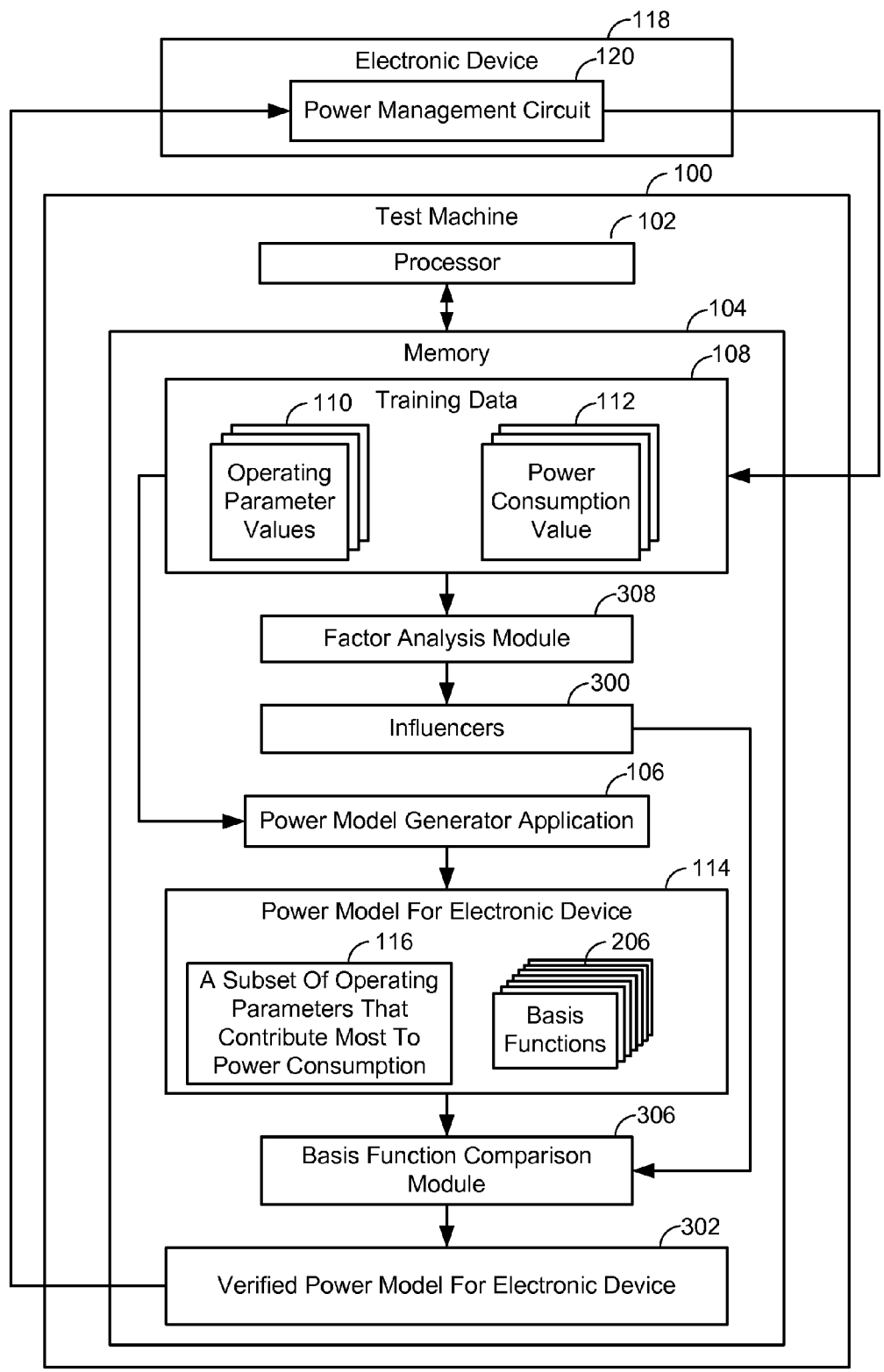
FIG. 3 is a block diagram of a third illustrative embodiment of a system to generate a power model for an electronic device.

Referring to FIG. 3, a third embodiment of a system that generates a power model 114 for an electronic device 118 is depicted. The system of FIG. 3 includes a test machine 100 coupled to the electronic device 118. The electronic device 118 includes a power management circuit 120 that manages power consumption of the electronic device 118 according to the power model 114. The test machine 100 includes a processor 102 coupled to a memory device 104. The test machine 100 of FIG. 3 generates the power model 114 for the electronic device 118 at least in part by reducing training data 108 to identify a subset 116 of operating parameters of the electronic device 118 that contribute most to power consumption of the electronic device 118.

As illustrated, the test machine 100 of FIG. 3 includes a factor analysis module 308. The factor analysis module 308 may be a module of computer program instructions that when executed by the processor 102 performs a factor analysis of the training data 108 to identify influencers 300. An influencer 300 is a description of a relationship among one or more operating parameters.

The test machine 100 of FIG. 3 also includes a basis function comparison module 306. The basis function comparison module 306 may be a module of computer program instructions that when executed by the processor 102 verify the generated power model 114 by comparing the basis functions 206 of the generated power model 114 to the influencers 300 identified by the factor analysis module 308. The verified power model 302 may be provided to the power manager circuit 120 of the electronic device 118. For example, when an influencer 300 is identified that relates operating parameter 1 and operating parameter 2, the basis function comparison module 306 may verify the power model 114 by comparing the basis functions 206 of the power model 114 to the identified influencer 300 to confirm that neither or both of operating parameter 1 and operating parameter 2 are included in the basis functions.

Although the factor analysis module 308 and the basis function comparison module 306 are described as modules of computer program instructions, readers of skill in the art will recognize that such modules may be implemented in many different ways such as with dedicated circuitry, one or more hardware devices, one or more software components executed by one or more hardware processing devices, or any combination thereof.

Figure 4:
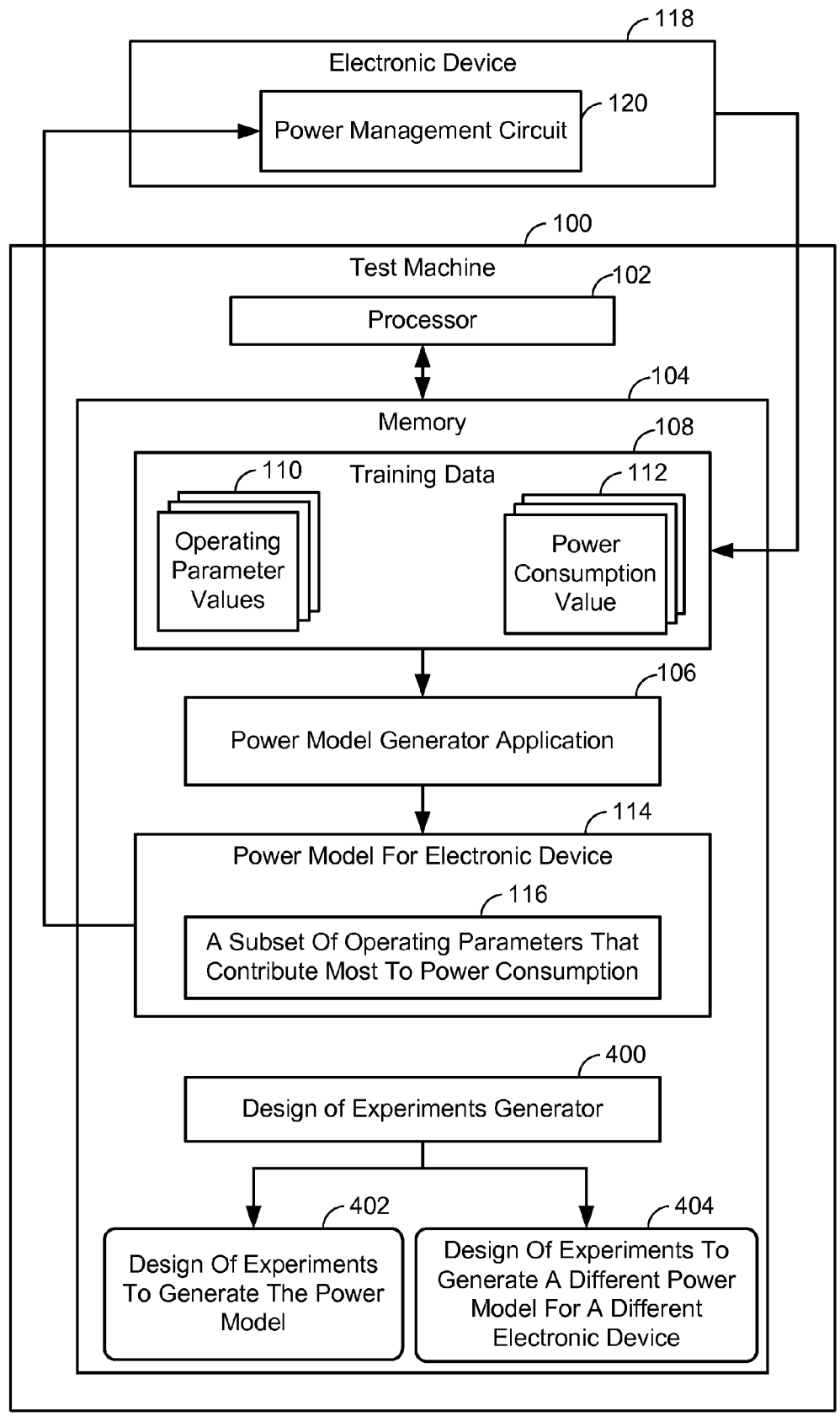
FIG. 4 is a block diagram of a fourth illustrative embodiment of a system to generate a power model for an electronic device.

Referring to FIG. 4, a fourth embodiment of a system that generates a power model 114 for an electronic device 118 is depicted. The system of FIG. 4 includes a test machine 100 coupled to the electronic device 118. The electronic device 118 includes a power management circuit 120 that manages power consumption of the electronic device 118 according to the power model 114. The test machine 100 includes a processor 102 coupled to a memory device 104. The test machine 100 of FIG. 4 generates the power model 114 for the electronic device 118 at least in part by reducing training data 108 to identify a subset 116 of operating parameters of the electronic device 118 that contribute most to power consumption of the electronic device 118.

As illustrated, the test machine 100 of FIG. 4 also includes a design of experiments generator 400. The design of experiments generator 400 of FIG. 4 may be a module of computer program instructions that when executed by the processor 102 establish a design of experiments 402 to generate the power model 106. The design of experiments 402 specifies a method of collecting the training data 108. The specified method of collecting the training data 108 may further specify the operating parameters and operating parameter values for which data is to be collected. Further, the design of experiments generator 400 may also be configured to establish a design of experiments 404 to generate a second power model for a second electronic device (not shown). For example, a design of experiments may specify a set of operating parameters for a processor and corresponding values to set during a power consumption test. Example parameters for the design of experiments for a processor may include a dispatch cycle parameter, a dual dispatch cycle parameter, a processor on-chip memory access parameter, a processor instruction branching parameter, an operating frequency parameter, an operating voltage parameter, and others as will occur to people of skill in the art. The example design of experiments for the processor may further specify a method of testing the processor such as iteratively setting values for a predefined range of values for one of the operating parameters while holding the value of all other parameters the same, measuring and recording the power consumption of the electronic device at each iteration, and repeating these iterative steps for each specified operating parameter.

Figure 5:
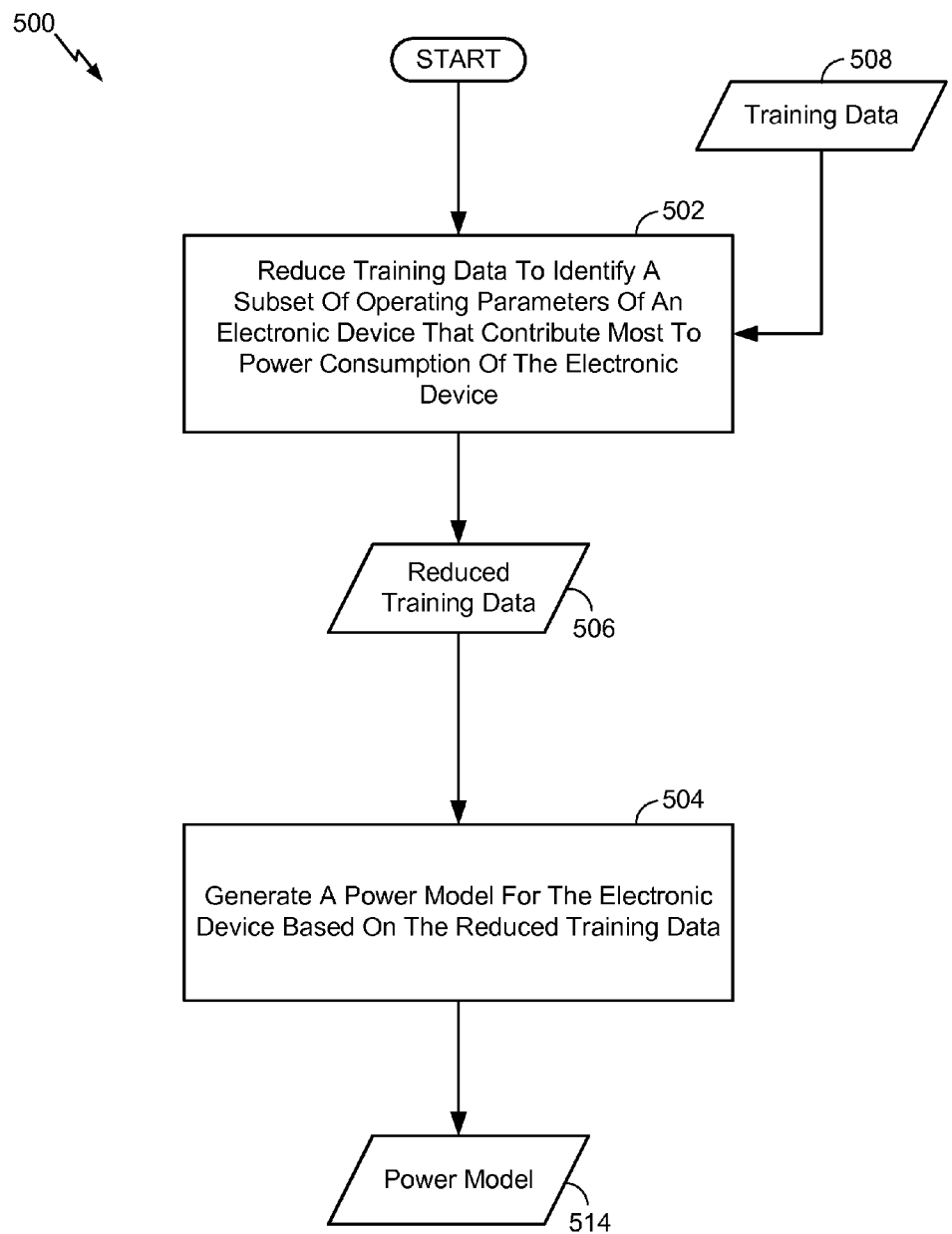
FIG. 5 is a flow diagram of a first illustrative embodiment of a method of generating a power model for an electronic device.

Referring to FIG. 5, a flow chart is depicted of a first embodiment of a method of generating a power model for an electronic device. The method 500 includes reducing training data to identify a subset of operating parameters of an electronic device that contribute most to power consumption of the electronic device at 502. For example, the processor 102 of FIG. 1 may execute the power model generator application 106 of FIG. 1 to reduce the training data 108 to identify the subset of operating parameters of the electronic device 118 of FIG. 1 that contribute most to the power consumption of the electronic device 118. For example, the processor 102 of FIG. 1 may reduce the training data 108, by generating an initial model based on the training data iteratively by selecting a basis function to add to the initial model to maximize a goodness-of-fit value of the initial model with respect to the training data and adding the selected basis function to the initial model. The initial model may be iteratively reduced by identifying a basis function of the initial model contributing least to an overall goodness-of-fit and removing the identified basis function from the initial model.

The method 500 of FIG. 5 also includes generating a power model 514 for the electronic device based on the reduced training data 506, at 504. In the method 500 of FIG. 5 the power model 514 is operative to predict a power consumption value corresponding to the electronic device responsive to a set of operating parameter values corresponding to operation of the electronic device. To illustrate, the processor 102 of FIG. 1 may execute the power model generator application 106 of FIG. 1 to generate a power model 114 for the electronic device 118 of FIG. 1 based on reduced training data. The processor 102 of FIG. 1 or FIG. 2 executing the power model generator application 106 may generate a power model 114 in various ways including, for example, by generating a software component executable by a hardware processing device to estimate power consumption of an electronic device 118 when provided with a set of operating parameter values of the electronic device 118, and in other ways as will occur to readers of skill in the art.

Figure 6:
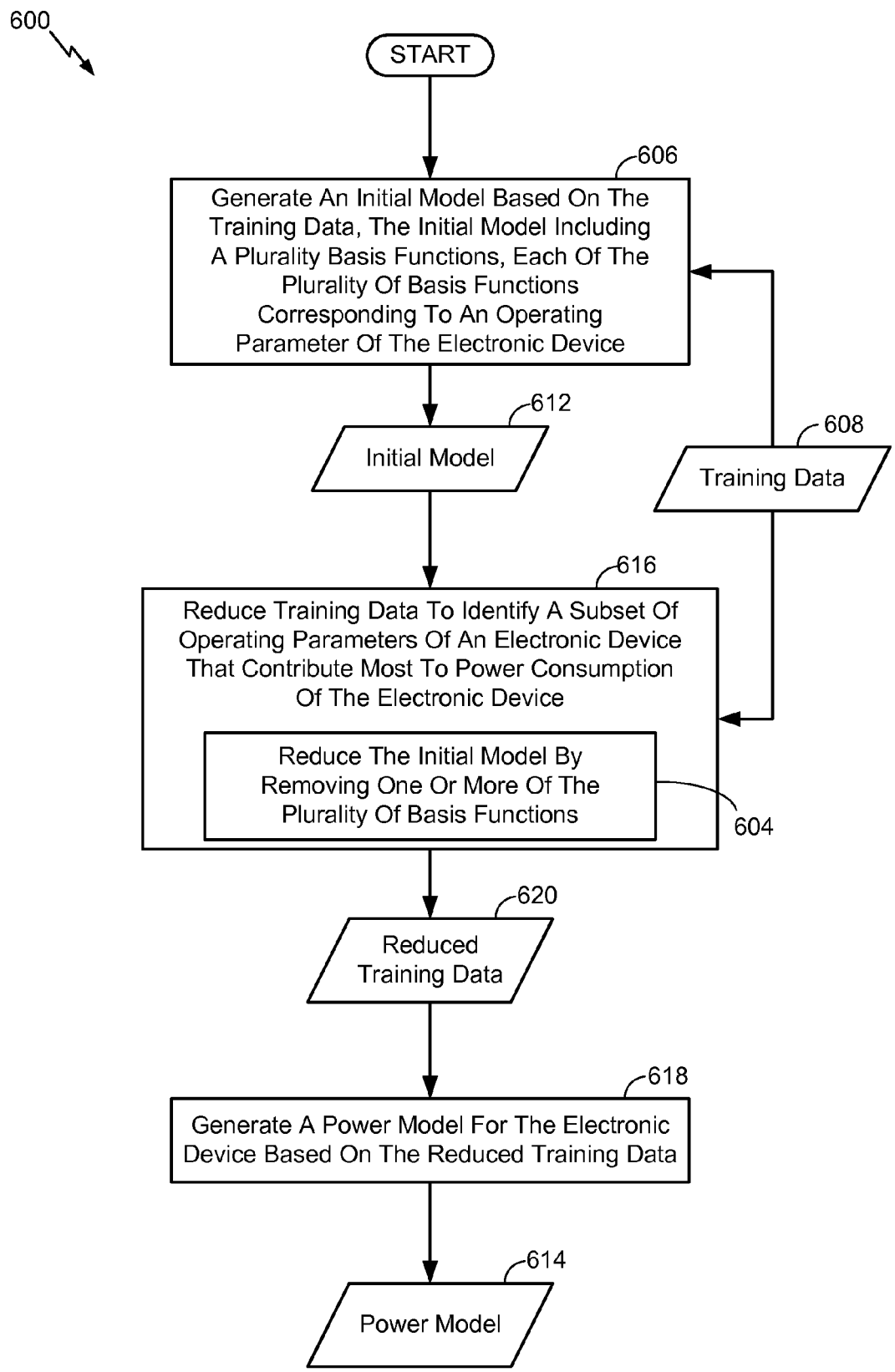
FIG. 6 is a flow diagram of a second illustrative embodiment of a method of generating a power model for an electronic device.

Referring to FIG. 6, a flow chart is depicted of a second embodiment of a method of generating a power model for an electronic device. The method 600 of FIG. 6 includes generating an initial model based on the training data, at 606. In the method 600 of FIG. 6, the initial model 612 includes a number of basis functions and each of the basis functions corresponds to an operating parameter of the electronic device. The processor 102 of FIG. 2, for example, may execute the power model generator application 106 of FIG. 2 and, optionally, the multivariate adaptive regression splines model generator 200 of FIG. 2 to generate the initial model 202 for the electronic device 118 based on the training data 108. The processor 102 of FIG. 2 may generate the initial model 202 in a number of iterations corresponding to a predetermined number of basis functions, with each iteration including selecting a basis function to add to the initial model 202 to maximize a goodness-of-fit value of the initial model with respect to the training data 108 and adding the selected basis function to the initial model 202.

The method 600 of FIG. 6 also includes reducing the training data 608 to identify a subset of operating parameters of the electronic device that contribute most to power consumption of the electronic device, 616, and generating the power model 614 for the electronic device based on the reduced training data 620, at 618. In the method 600 of FIG. 6, reducing the training data 608 includes reducing the initial model 612 by iteratively removing one or more of the basis functions of the initial model, at 604. The processor 102 of FIG. 2, for example, may execute the power model generator application 106 of FIG. 2 and, optionally, the multivariate adaptive regression splines model generator 200 of FIG. 2 to reduce the training data 108 as in FIG. 6 by reducing the initial model 202 within a predetermined number of iterations, with each iteration including identifying a basis function of the initial model 202 contributing least to an overall goodness-of-fit and removing the identified basis function from the initial model.

Figure 7:
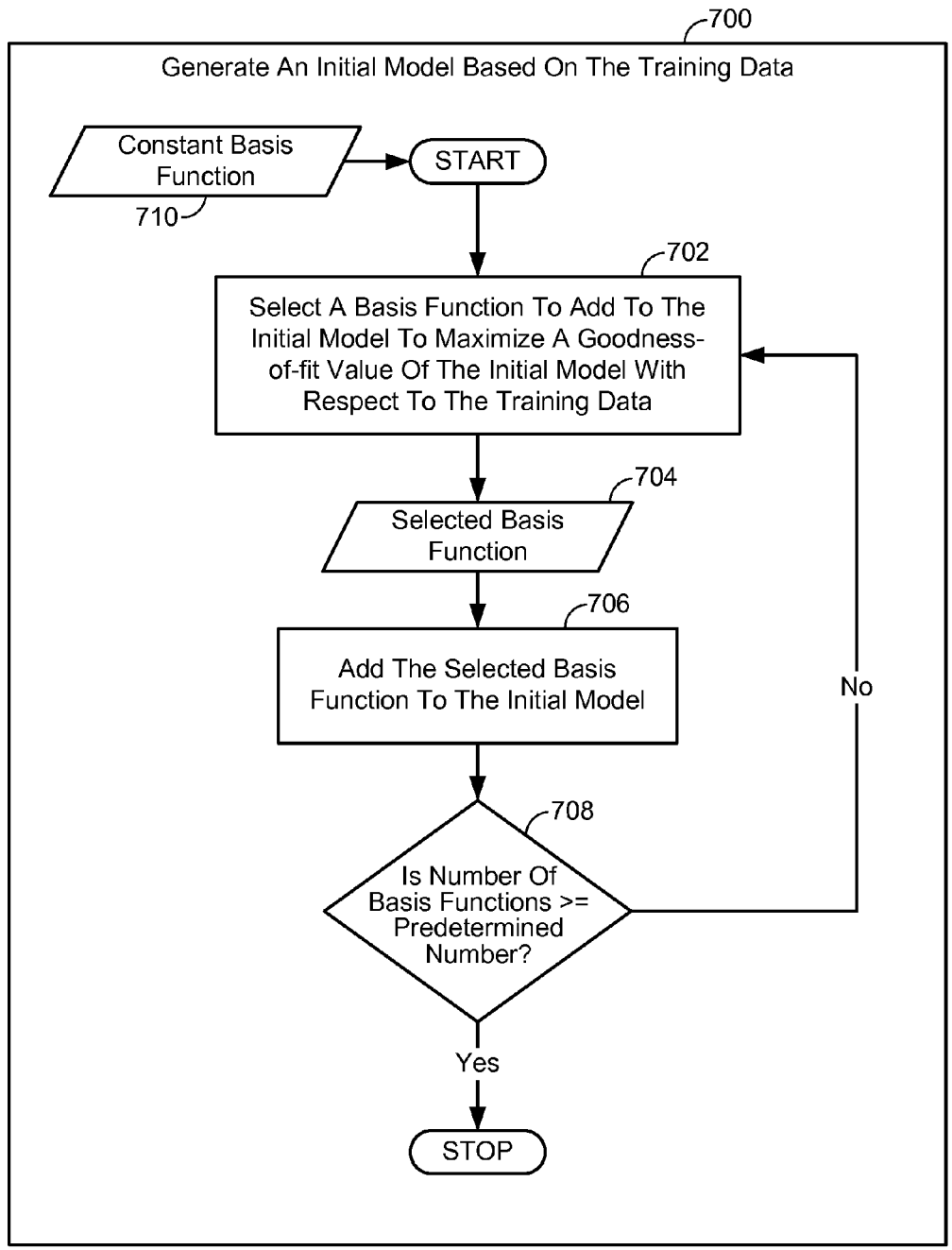
FIG. 7 is a flow diagram of an illustrative embodiment of a method of generating an initial model based on training data.

Referring to FIG. 7, a flow chart is depicted of a first embodiment of a method 700 of generating an initial model based on training data. In an illustrative embodiment, the method 700 may be implemented at 606 of FIG. 6. The method 700 of FIG. 7 begins with a constant basis function 710 and includes selecting a basis function 704 to add to the initial model to maximize a goodness-of-fit value of the initial model with respect to the training data, at 702. The processor 102 of FIG. 2, for example, may execute the power model generator application 106 of FIG. 2 and, optionally, the multivariate adaptive regression splines model generator 200 of FIG. 2 to select the basis function 206 to add to the initial model 202 to maximize the goodness-of-fit value of the initial model 202 with respect to the training data 108.

The method 700 of FIG. 7 also includes adding the selected basis function 704 to the initial model, at 706. The processor 102 of FIG. 2, for example, may execute the power model generator application 106 of FIG. 2 and, optionally, the multivariate adaptive regression splines model generator 200 of FIG. 2 to add the selected basis function 206 to the initial model 202 by performing a generalized cross validation (GCV) operation to maximize the goodness-of-fit value of the initial model 202 with respect to the training data 108 when selecting a basis function to add to the initial model 202.

A determination is made whether the number of basis functions in the initial model is greater than or equal to a predetermined number, at 708. If the number of basis functions is not greater than or equal to the predetermined number, the method 700 continues at 702, to select another basis function 704 to add to the initial model to maximize the goodness-of-fit value of the initial model with respect to the training data. If the number of basis functions is not greater than or equal to the predetermined number, the method 700 may complete and the initial model may be generated. For example, the processor 102 of FIG. 2 may execute the power model generator application 106 of FIG. 2 and, optionally, the multivariate adaptive regression splines model generator 200 of FIG. 2 to determine whether the number of basis functions in the initial model is greater than or equal to the predetermined number 214 by maintaining a count of the number of basis functions making up the initial model and comparing that number with the predetermined number 214.

Figure 8:
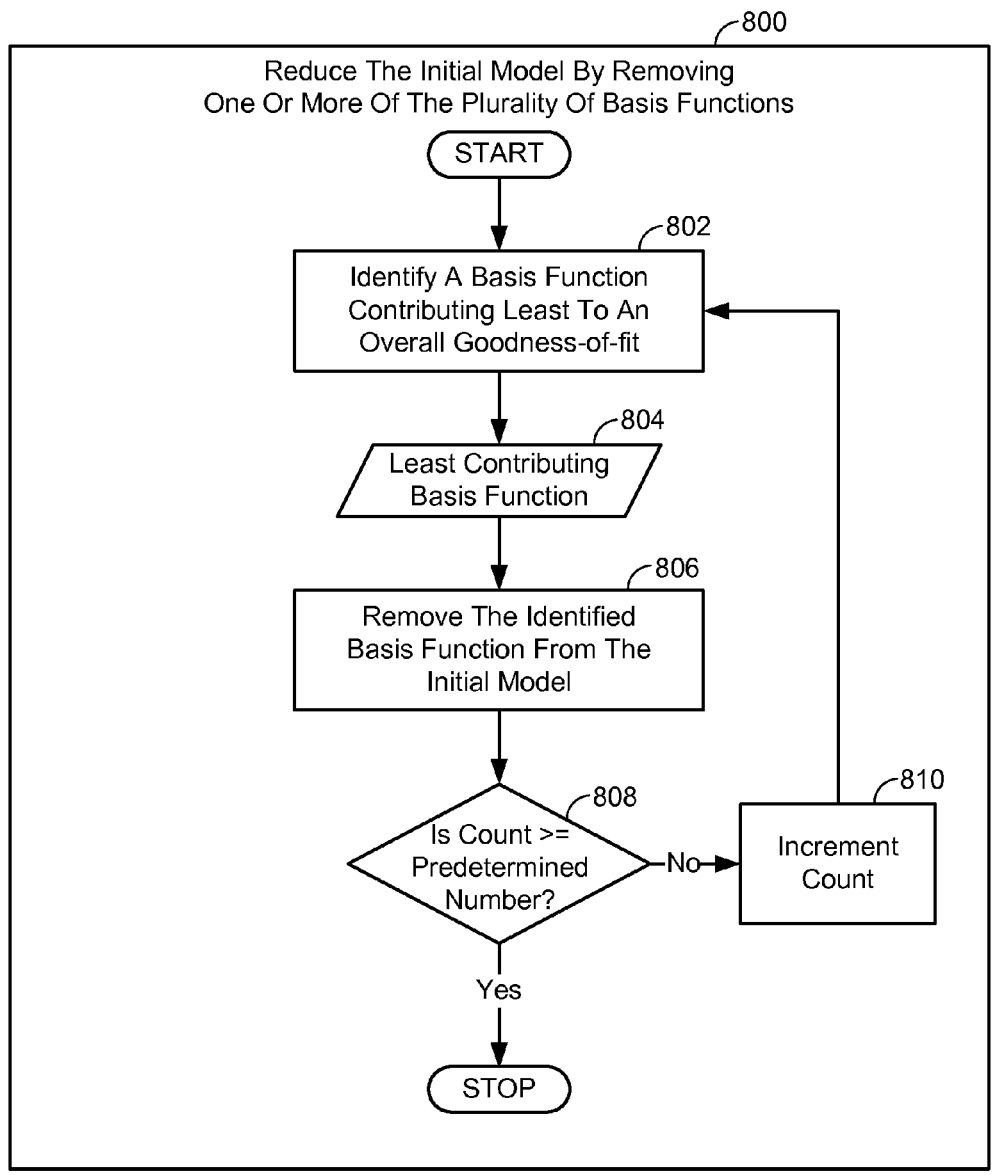
FIG. 8 is a flow diagram of an illustrative embodiment of a method of reducing an initial model by iteratively removing one or more basis functions from the initial model.

Referring to FIG. 8, a flow chart is depicted of a first embodiment of a method 800 of reducing the initial model by iteratively removing one or more of the basis functions from the initial model. In an illustrative embodiment, the method 800 of FIG. 8 may be implemented at 606 of FIG. 6. The method 800 of FIG. 8 includes identifying a basis function 804 of the initial model contributing least to an overall goodness-of-fit, at 802, and removing the identified basis function 804 from the initial model, at 806. The processor 102 of FIG. 2, for example, may execute the power model generator application 106 of FIG. 2 and, optionally, the multivariate adaptive regression splines model generator 200 of FIG. 2 to identify a basis function 208 of the initial model contributing least to an overall goodness-of-fit by iteratively performing a least squares operation for each basis function to identify the basis function contributing least to the overall goodness-of-fit of the initial model.

A determination is made, at 808, whether a count is greater than or equal to a predetermined number. If the count is not greater than or equal to the predetermined number, the method of FIG. 8 continues to a subsequent iteration where another basis function 804 of the initial model is identified as contributing least to an overall goodness-of-fit, at 802. If the count is greater than or equal to the predetermined number, the method 800 may stop and the reduction of the initial model may be complete. The processor 102 of FIG. 2, for example, may execute the power model generator application 106 of FIG. 2 and, optionally, the multivariate adaptive regression splines model generator 200 of FIG. 2 to determine whether the count is greater than or equal to a predetermined number 216 by maintaining the count for each iteration and comparing the count to the predetermined number 216.

Figure 9:
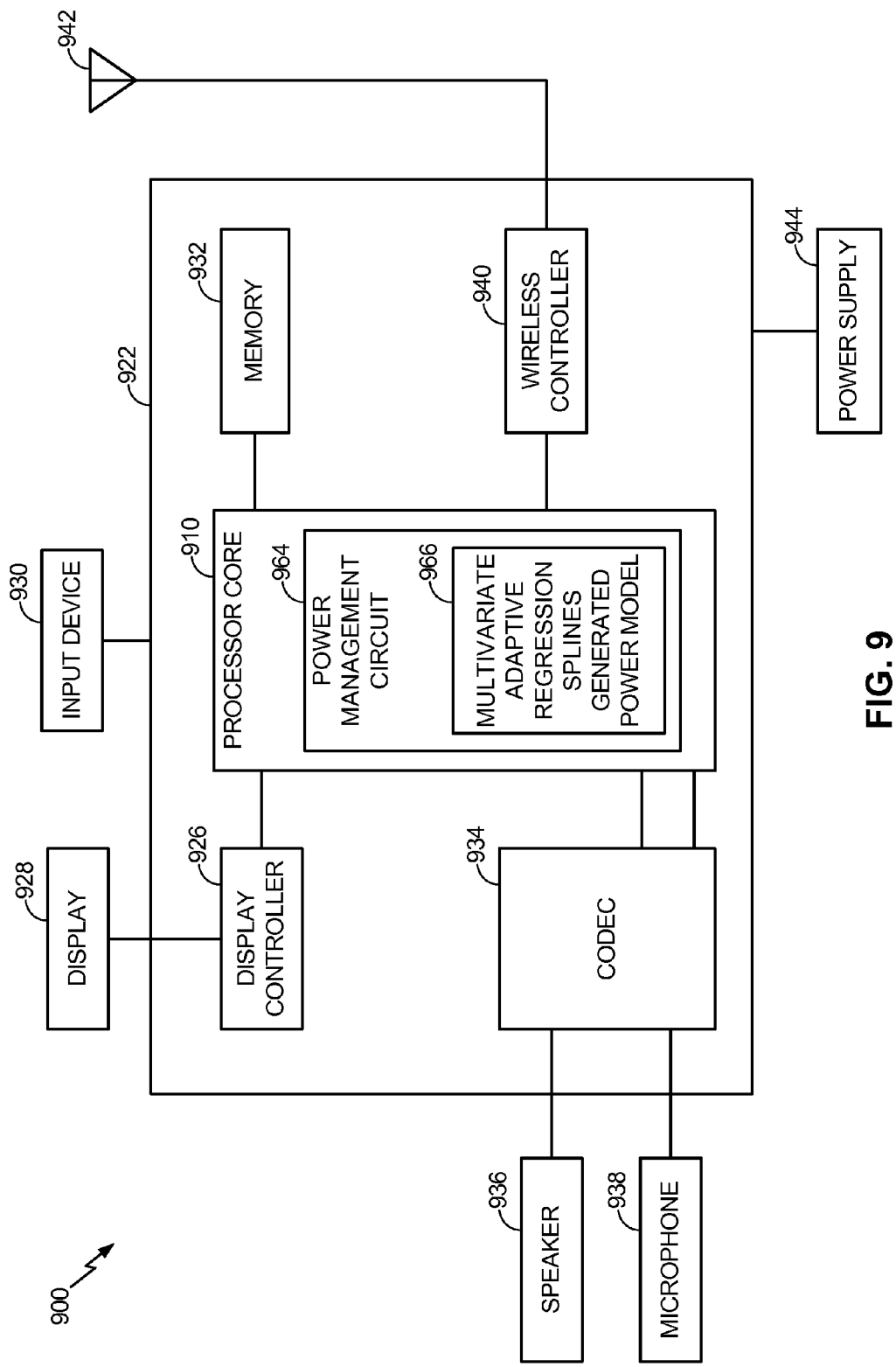
FIG. 9 is a block diagram of a first particular embodiment of a system that includes a power management circuit that is responsive to a power model generated with a multivariate adaptive regression splines operation.

FIG. 9 is a block diagram of a first particular embodiment of a system 900 including a power management circuit 964 that is responsive to a power model 966 generated with a multivariate adaptive regression splines operation. The system 900 may be implemented in a portable electronic device and includes a processor core 910, such as one or more general purpose processors or digital signal processors (DSP), coupled to a computer readable medium, such as a memory 932, storing computer readable instructions and data, such as used by the multivariate adaptive regression splines generated power model 966. The system 900 includes a power management circuit 964 that manages power consumption of one or more of the electronic devices of the system 900 such as, for example, the processor core 910. The power management circuit 964 is configured to set at least one operating parameter value in accordance with the multivariate adaptive regression splines generated power model 966 to dynamically manage power consumption of the electronic device, the processor core 910, in real-time or near real-time. In some embodiments, the power model 966 includes a number of operating parameters excluding a processor on-chip memory access parameter and excluding a processor instruction branching performance parameter. For example, the processor 102 of FIG. 1, executing the power model generator 106 of FIG. 1, may determine that the processor on-chip memory accesses and processor instruction branching performance are not included in the operating parameters that contribute most to power consumption of the electronic device 118. As such, the processor 102 of FIG. 1 may exclude the operating parameters for the processor on-chip memory accesses and processor instruction branching performance from the generated power model 114.

Although the system 900 of FIG. 9 depicts a power management circuit 964 that dynamically manages the power consumption of the processor core 910 responsive to the multivariate adaptive regression splines generated power model 966, in other embodiments power consumption of the processor core 910 may not be dynamically managed. Rather, one or more operating parameter values may be set in accordance with the multivariate adaptive regression splines generated power model 966 at manufacturing-time. In embodiments in which operating parameter values are set in accordance with the multivariate adaptive regression splines generated power model 966 statically, the multivariate adaptive regression splines generated power model 966 may predict power consumption of the processor core 910 based on values of a number of operating parameters excluding a processor on-chip memory access parameter and excluding a processor instruction branching performance parameter.

The system 900 also includes a display controller 926 coupled to the processor core 910 and to a display device 928. A coder/decoder (CODEC) 934 can also be coupled to the processor core 910. A speaker 936 and a microphone 938 can be coupled to the CODEC 934. A wireless controller 940 can be coupled to the processor core 910 and to a wireless antenna 942.

In a particular embodiment, the processor core 910, the display controller 926, the memory 932, the CODEC 934, and the wireless interface 940 are included in a system-in-package or system-on-chip device 922. In a particular embodiment, an input device 930 and a power supply 944 are coupled to the system-on-chip device 922. Moreover, in a particular embodiment, as illustrated in FIG. 9, the display device 928, the input device 930, the speaker 936, the microphone 938, the wireless antenna 942, and the power supply 944 are external to the system-on-chip device 922. However, each of the display device 928, the input device 930, the speaker 936, the microphone 938, the wireless antenna 942, and the power supply 944 can be coupled to a component of the system-on-chip device 922, such as an interface or a controller.

Figure 10:
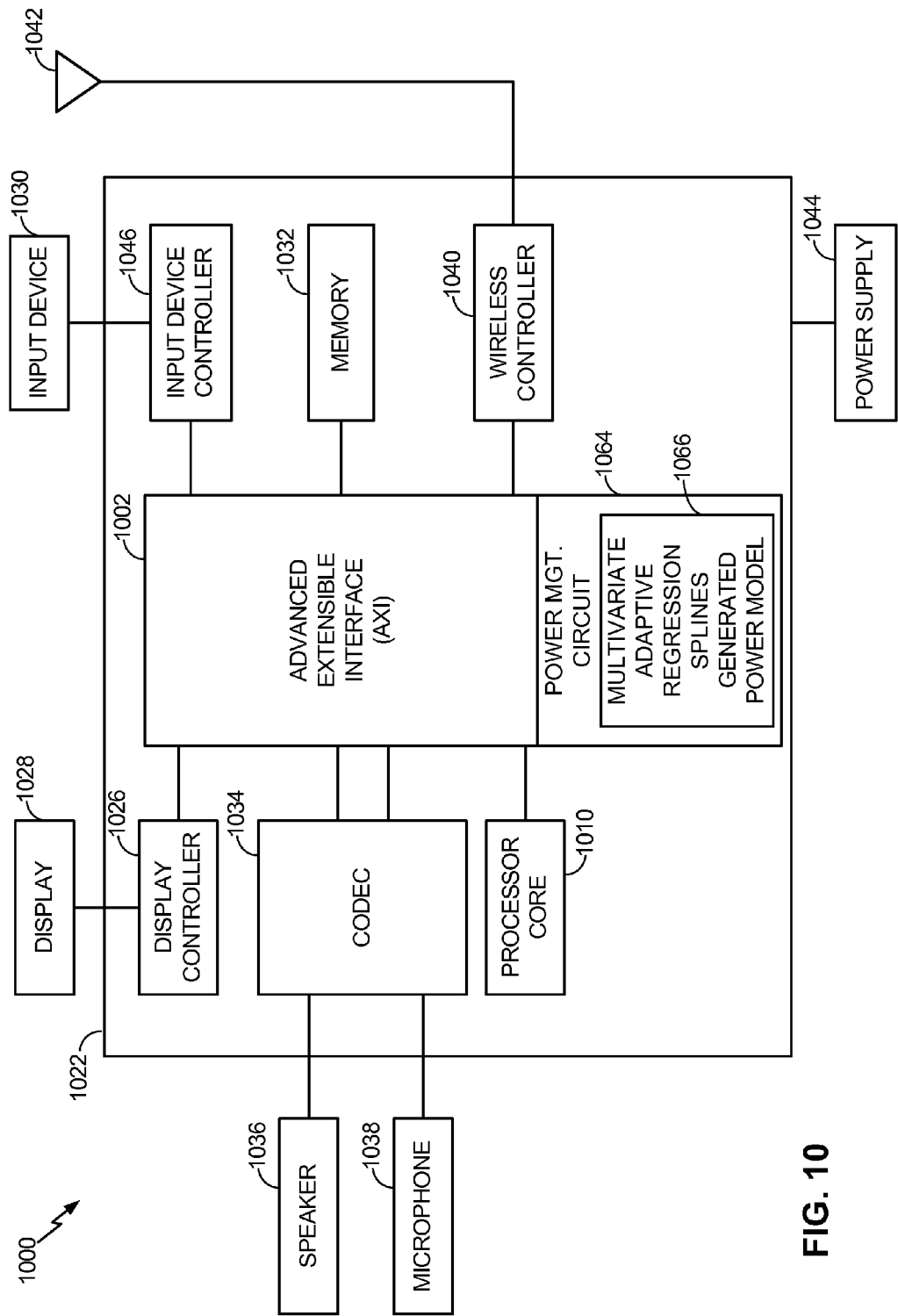
FIG. 10 is a block diagram of a second particular embodiment of a system including a power management circuit that is responsive to a power model generated with a multivariate adaptive regression splines operation.

FIG. 10 is a block diagram of a second particular embodiment of a system 1000 including a power management circuit 1064 that is responsive to a power model 1066 generated with a multivariate adaptive regression splines operation. The system 1000 may be implemented in a portable electronic device and includes a processor core 1010, such as a digital signal processor (DSP), coupled to a computer readable medium, such as a memory 1032, storing computer readable instructions. A display controller 1026 is coupled to the processor core 1010 and to a display device 1028. A coder/decoder (CODEC) 1034 can also be coupled to the processor core 1010. A speaker 1036 and a microphone 1038 can be coupled to the CODEC 1034. A wireless interface 1040 can be coupled to the processor core 1010 and to a wireless antenna 1042. The CODEC 1034, display controller 1026, input device controller 1046, memory 1032, wireless controller 1040, and processor core 1010 are coupled via an advanced extensible interface (AXI) 1002.

The power management circuit 1064 manages power consumption of one or more of the electronic devices of the system 1000 such as, for example, the Advanced Extensible Interface (AXI) 1002. The power management circuit 1064 is configured to set at least one operating parameter value in accordance with the multivariate adaptive regression splines generated power model 1066 to dynamically manage power consumption of the electronic device, the AXI 1002, in real-time or near real-time. In some embodiments, the multivariate adaptive regression splines generated power model 1066 of FIG. 10 includes not more than six operating parameters corresponding to the electrical interface and the not more than six operating parameters do not include any of the following operating parameters: a parameter indicating a number of masters communicating via the electrical interface; a parameter indicating a number of slaves communicating via the electrical interface; and a parameter indicating burst length of data communications via the electrical interface. For example, the processor 102 of FIG. 1, executing the power model generator 106 of FIG. 1, may determine that six other operating parameters contribute to power consumption of the electrical interface more than contributions of a parameter indicating a number of masters communicating via the electrical interface, a parameter indicating a number of slaves communicating via the electrical interface, or a parameter indicating burst length of data communications via the electrical interface. As such, the processor 102 may exclude the less contributing operating parameters from the generated power model 1066. As a result, the generated power model 1066 may operate independently of the less contributing operating parameters.

In a particular embodiment, power consumption of the AXI 1002 is not dynamically managed by the power management circuit 1064 and instead operating parameter values of the AXI 1002 are statically set in accordance with the multivariate adaptive regression splines generated power model 1066. The operating parameter values may be set at manufacture of the AXI 1002. In embodiments in which operating parameter values of the AXI 1002 are statically set, the multivariate adaptive regression splines generated power model 1066 may predict power consumption of the AXI 1002 based on values of a plurality of operating parameters excluding a parameter indicating a number of masters communicating via the electrical interface, a parameter indicating a number of slaves communicating via the electrical interface, and a parameter indicating burst length of data communications via the electrical interface.

In a particular embodiment, the processor core 1010, the display controller 1026, the memory 1032, the CODEC 1034, and the wireless controller 1040 are included in a system-in-package or system-on-chip device 1022. In a particular embodiment, an input device 1030 and a power supply 1044 are coupled to the system-on-chip device 1022. Moreover, in a particular embodiment, as illustrated in FIG. 10, the display device 1028, the input device 1030, the speaker 1036, the microphone 1038, the wireless antenna 1042, and the power supply 1044 are external to the system-on-chip device 1022. However, each of the display device 1028, the input device 1030, the speaker 1036, the microphone 1038, the wireless antenna 1042, and the power supply 1044 can be coupled to a component of the system-on-chip device 1022, such as an interface or a controller.

FIG. 11 is a block diagram of a third particular embodiment of a system 1100 including a power management circuit 1164 that is responsive to a power model 1166 generated with a multivariate adaptive regression splines operation. The system 1100 may be implemented in a portable electronic device and includes a processor core 1110, such as a digital signal processor (DSP), coupled to a computer readable medium, such as a memory 1132, storing computer readable instructions. The system 1100 includes a power management circuit 1164 that may be a power management integrated circuit (PMIC) that manages power consumption of one or more of the electronic devices of the system 1100 such as, for example, the processor core 1110, a CODEC 1134, and a wireless controller 1140. The power management circuit 1164 may be configured to set at least one operating parameter value of each of the electronic devices in accordance with the multivariate adaptive regression splines generated power model 1166 to dynamically manage power consumption of the electronic device, and in turn, of the system 1100 of FIG. 11, in real-time or near real-time.

A display controller 1126 is coupled to the processor core 1110 and to a display device 1128. The coder/decoder (CODEC) 1134 can also be coupled to the processor core 1110. A speaker 1136 and a microphone 1138 can be coupled to the CODEC 1134. The wireless controller 1140 can be coupled to the processor core 1110 and to a wireless antenna 1142.

In a particular embodiment, the processor core 1110, the display controller 1126, the memory 1132, the CODEC 1134, and the wireless controller 1140 are included in a system-in-package or system-on-chip device 1122. In a particular embodiment, an input device 1130 and a power supply 1144 are coupled to the system-on-chip device 1122. Moreover, in a particular embodiment, as illustrated in FIG. 11, the display device 1128, the input device 1130, the speaker 1136, the microphone 1138, the wireless antenna 1142, and the power supply 1144 are external to the system-on-chip device 1122. However, each of the display device 1128, the input device 1130, the speaker 1136, the microphone 1138, the wireless antenna 1142, and the power supply 1144 can be coupled to a component of the system-on-chip device 1122, such as an interface or a controller.

The foregoing disclosed devices and functionalities (such as the devices of FIGS. 1-4 and 9-11, the methods of FIGS. 5-8, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 12 depicts a particular illustrative embodiment of an electronic device manufacturing process 1200.

Physical device information 1202 is received in the manufacturing process 1200, such as at a research computer 1206. The physical device information 1202 may include design information representing at least one physical property of a semiconductor device, such as a power model generating processor as illustrated in any of FIGS. 1-4 or operating in accordance with any of FIGS. 5-8. For example, the physical device information 1202 may include physical parameters, material characteristics, and structure information that is entered via a user interface 1204 coupled to the research computer 1206. The research computer 1206 includes a processor 1208, such as one or more processing cores, coupled to a computer readable medium such as a memory 1210. The memory 1210 may store computer readable instructions that are executable to cause the processor 1208 to transform the physical device information 1202 to comply with a file format and to generate a library file 1212.

In a particular embodiment, the library file 1212 includes at least one data file including the transformed design information. For example, the library file 1212 may include a library of semiconductor devices including a power model generating processor as illustrated in any of FIGS. 1-4 or formed in accordance with any of FIGS. 5-8, that is provided for use with an electronic design automation (EDA) tool 1220.

The library file 1212 may be used in conjunction with the EDA tool 1220 at a design computer 1214 including a processor 1216, such as one or more processing cores, coupled to a memory 1218. The EDA tool 1220 may be stored as processor executable instructions at the memory 1218 to enable a user of the design computer 1214 to design a circuit with the power model generating processor as illustrated in any of FIGS. 1-4 or that operates in accordance with any of FIGS. 5-8, of the library file 1212. For example, a user of the design computer 1214 may enter circuit design information 1222 via a user interface 1224 coupled to the design computer 1214. The circuit design information 1222 may include design information representing at least one physical property of a semiconductor device, such as power model generating processor as illustrated in any of FIGS. 1-4 or that operates in accordance with any of FIGS. 5-8. To illustrate, the circuit design property may include identification of particular circuits and relationships to other elements in a circuit design, positioning information, feature size information, interconnection information, or other information representing a physical property of a semiconductor device.

The design computer 1214 may be configured to transform the design information, including the circuit design information 1222, to comply with a file format. To illustrate, the file formation may include a database binary file format representing planar geometric shapes, text labels, and other information about a circuit layout in a hierarchical format, such as a Graphic Data System (GDSII) file format. The design computer 1214 may be configured to generate a data file including the transformed design information, such as a GDSII file 1226 that includes information describing the power model generating processor as illustrated in any of FIGS. 1-4 or that operates in accordance with any of FIGS. 5-8, in addition to other circuits or information. To illustrate, the data file may include information corresponding to a system-on-chip (SOC) that includes the power model generating processor device as illustrated in any of FIGS. 1-4 or that operates in accordance with any of FIGS. 5-8 and that also includes additional electronic circuits and components within the SOC.

The GDSII file 1226 may be received at a fabrication process 1228 to manufacture the power model generating processor as illustrated in any of FIGS. 1-4 or that operates in accordance with any of FIGS. 5-8, according to transformed information in the GDSII file 1226. For example, a device manufacture process may include providing the GDSII file 1226 to a mask manufacturer 1230 to create one or more masks, such as masks to be used for photolithography processing, illustrated as a representative mask 1232. The mask 1232 may be used during the fabrication process to generate one or more wafers 1234, which may be tested and separated into dies, such as a representative die 1236. The die 1236 includes a circuit including the power model generating processor as illustrated in any of FIGS. 1-4 or that operates in accordance with any of FIGS. 5-8.

The die 1236 may be provided to a packaging process 1238 where the die 1236 is incorporated into a representative package 1240. For example, the package 1240 may include the single die 1236 or multiple dies, such as a system-in-package (SiP) arrangement. The package 1240 may be configured to conform to one or more standards or specifications, such as Joint Electron Device Engineering Council (JEDEC) standards.

Information regarding the package 1240 may be distributed to various product designers, such as via a component library stored at a computer 1246. The computer 1246 may include a processor 1248, such as one or more processing cores, coupled to a memory 1250. A printed circuit board (PCB) tool may be stored as processor executable instructions at the memory 1250 to process PCB design information 1242 received from a user of the computer 1246 via a user interface 1244. The PCB design information 1242 may include physical positioning information of a packaged semiconductor device on a circuit board, the packaged semiconductor device corresponding to the package 1240 including the power model generating processor device as illustrated in any of FIGS. 1-4 or that operates in accordance with any of FIGS. 5-8.

The computer 1246 may be configured to transform the PCB design information 1242 to generate a data file, such as a GERBER file 1252 with data that includes physical positioning information of a packaged semiconductor device on a circuit board, as well as layout of electrical connections such as traces and vias, where the packaged semiconductor device corresponds to the package 1240 including the power model generating processor as illustrated in any of FIGS. 1-4 or that operates in accordance with any of FIGS. 5-8. In other embodiments, the data file generated by the transformed PCB design information may have a format other than a GERBER format.

The GERBER file 1252 may be received at a board assembly process 1254 and used to create PCBs, such as a representative PCB 1256, manufactured in accordance with the design information stored within the GERBER file 1252. For example, the GERBER file 1252 may be uploaded to one or more machines for performing various steps of a PCB production process. The PCB 1256 may be populated with electronic components including the package 1240 to form a representative printed circuit assembly (PCA) 1258.

The PCA 1258 may be received at a product manufacture process 1260 and integrated into one or more electronic devices, such as a first representative electronic device 1262 and a second representative electronic device 1264. As an illustrative, non-limiting example, the first representative electronic device 1262, the second representative electronic device 1264, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1262 and 1264 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 12 illustrates remote units according to teachings of the disclosure, the disclosure is not limited to these exemplary illustrated units. Embodiments of the disclosure may be suitably employed in any device which includes active integrated circuitry including memory and on-chip circuitry.

Thus, power model generating processor as illustrated in any of FIGS. 1-4 or that operates in accordance with any of FIGS. 5-8, may be fabricated, processed, and incorporated into an electronic device, as described in the illustrative process 1200. One or more aspects of the embodiments disclosed with respect to FIGS. 1-8 may be included at various processing stages, such as within the library file 1212, the GDSII file 1226, and the GERBER file 1252, as well as stored at the memory 1210 of the research computer 1206, the memory 1218 of the design computer 1214, the memory 1250 of the computer 1246, the memory of one or more other computers or processors (not shown) used at the various stages, such as at the board assembly process 1254, and also incorporated into one or more other physical embodiments such as the mask 1232, the die 1236, the package 1240, the PCA 1258, other products such as prototype circuits or devices (not shown), or any combination thereof. For example, the GDSII file 1226 or the fabrication process 1228 can include a computer readable tangible medium storing instructions executable by a computer, a controller of a material deposition system, or other electronic device, the instructions including instructions that are executable by a processor of the computer or controller to initiate formation of a power model generating processor as illustrated in any of FIGS. 1-4 or that operates in accordance with any of FIGS. 5-8. For example, the instructions may include instructions that are executable by a computer to reduce training data to identify a subset of operating parameters of an electronic device that contribute most to power consumption of the electronic device by generating an initial model based on training data, where the initial model includes a number of basis functions and each of the number of basis functions corresponds to an operating parameter of the electronic device, and by iteratively removing one or more of the plurality of basis functions. The instructions may also include instructions that are executable by a computer to generate a power model for the electronic device based on the reduced training data, where the power model is operative to predict a power consumption value corresponding to the electronic device responsive to a set of operating parameter values corresponding to operation of electronic device.

Although various representative stages of production from a physical device design to a final product are depicted, in other embodiments fewer stages may be used or additional stages may be included. Similarly, the process 1200 may be performed by a single entity, or by one or more entities performing various stages of the process 1200.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, a hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A system comprising:
   a processor configured to:
      identify a subset of operating parameters of an electronic device that contributes most to power consumption of the electronic device by reducing training data; and
      generate a power model for the electronic device based on the reduced training data, wherein the power model is operable to predict, responsive to a set of operating parameter values corresponding to operation of the electronic device, a power consumption value corresponding to the electronic device.

2. The system of claim 1, wherein the processor is further configured to reduce the training data by:
   generating an initial model based on the training data, the initial model comprising a plurality of basis functions, each of the plurality of basis functions corresponding to an operating parameter of the electronic device that contributes to power consumption of the electronic device; and
   reducing the initial model by iteratively removing one or more of the plurality of basis functions.

3. The system of claim 2, wherein the processor reduces the initial model within a predetermined number of iterations, with each iteration comprising:
   identifying a basis function of the plurality of basis functions of the initial model contributing least to an overall goodness-of-fit; and
   removing the identified basis function from the initial model.

4. The system of claim 3, wherein the predetermined number of iterations is determined based on a defined value corresponding to a maximum number of operating parameters to identify as the operating parameters contributing most to the power consumption of the electronic device.

5. The system of claim 2, wherein the processor generates the initial model in a number of iterations corresponding to a predetermined number of basis functions, with each iteration comprising:
   selecting a basis function to add to the initial model to maximize a goodness-of-fit value of the initial model with respect to the training data; and
   adding the selected basis function to the initial model.

6. The system of claim 5, wherein the predetermined number of basis functions is a user defined value.

7. The system of claim 1, wherein the training data includes a plurality of operating parameter values and corresponding power consumption values of the electronic device.

8. The system of claim 1, integrated in at least one semiconductor die.

9. The system of claim 1, further comprising at least one of: a communications device, a fixed location data unit, or a computer, into which the processor is integrated.

10. The system of claim 1, wherein the electronic device comprises a power management circuit that is responsive to the power model.

11. The system of claim 10, wherein the power management circuit is configured to set at least one operating parameter value in accordance with the power model to dynamically manage power consumption of the electronic device in real-time.

12. The system of claim 10, further comprising a processor core, wherein the power model excludes processor on-chip memory accesses and excludes processor instruction branching performance.

13. The system of claim 10, wherein the electronic device comprises an electrical interface.

14. The system of claim 13, wherein the processor reduces the training data by removing:
   a parameter indicating a number of masters communicating via the electrical interface;
   a parameter indicating a number of slaves communicating via the electrical interface; and
   a parameter indicating burst length of data communications via the electrical interface.

15. The system of claim 13, wherein the electrical interface is compliant with an advanced extensible interface (AXI) protocol.

16. The system of claim 10, integrated in at least one semiconductor die.

17. The system of claim 10, further comprising at least one of: a set top box, a music player, a video player, an entertainment unit, a navigation device, a communications device, a personal digital assistant (PDA), a fixed location data unit, or a computer, into which the power management circuit is integrated.

18. The system of claim 1, wherein the electronic device includes an electrical interface comprising one or more operating parameter values that are set in accordance with the power model, wherein the power model is operable to predict power consumption of the electrical interface based on values of a plurality of operating parameters excluding a parameter indicating a number of masters communicating via the electrical interface, a parameter indicating a number of slaves communicating via the electrical interface, and a parameter indicating burst length of data communications via the electrical interface.

19. The system of claim 18, integrated in at least one semiconductor die.

20. The system of claim 18, wherein the electronic device is at least one of: a set top box, a music player, a video player, an entertainment unit, a navigation device, a communications device, a personal digital assistant (PDA), a fixed location data unit, or a computer.

21. An apparatus comprising:
   means for identifying a subset of operating parameters of an electronic device that contributes most to power consumption of the electronic device by reducing training data; and
   means for generating a power model for the electronic device based on the reduced training data, wherein the power model is operable to predict, responsive to a set of operating parameter values corresponding to operation of the electronic device, a power consumption value corresponding to the electronic device.

22. The apparatus of claim 21, integrated in at least one semiconductor die.

23. The apparatus of claim 21, further comprising at least one of: a communications device, a fixed location data unit, or a computer, into which the means for reducing the training data and the means for generating the power model are integrated.

24. A method comprising:
identifying a subset of operating parameters of an electronic device that contributes most to power consumption of the electronic device by reducing training data; and
generating a power model for the electronic device based on the reduced training data, wherein the power model is operable to predict, responsive to a set of operating parameter values corresponding to operation of the electronic device, a power consumption value corresponding to the electronic device.

25. The method of claim 24, wherein generating the power model for the electronic device further comprises performing a multivariable adaptive regression splines operation.

26. The method of claim 24, further comprising verifying the generated power model.

27. The method of claim 26, wherein verifying the generated power model further comprises:
performing a factor analysis of the training data to identify a plurality of influencers prior to generating the power model; and
comparing basis functions of the generated power model to the identified plurality of influencers.

28. The method of claim 24, further comprising establishing a design of experiments to generate the power model, the design of experiments specifying a method of collecting the training data.

29. The method of claim 24, further comprising establishing a design of experiments to generate a second power model for a second electronic device, the design of experiments specifying a method of collecting training data for the second electronic device, the training data for the second electronic device comprising a plurality of operating parameter values and corresponding power consumption values for the second electronic device.

30. The method of claim 24, wherein reducing the training data and generating the power model for the electronic device are performed at a processor integrated into a second electronic device.

31. The method of claim 24, wherein the electronic device includes a processor, and further comprising setting one or more operating parameters of the processor in accordance with the power model, wherein the power model is operable to predict power consumption of the processor based on values of a plurality of operating parameters excluding a processor on-chip memory access parameter and excluding a processor instruction branching performance parameter.

32. The method of claim 31, wherein the processor is integrated in at least one semiconductor die.

33. The method of claim 31, wherein the electronic device is at least one of: a set top box, a music player, a video player, an entertainment unit, a navigation device, a communications device, a personal digital assistant (PDA), a fixed location data unit, or a computer.

34. A method comprising:
a first step for identifying a subset of operating parameters of an electronic device that contributes most to power consumption of the electronic device by reducing training data; and
a second step for generating a power model for the electronic device based on the reduced training data, wherein the power model is operable to predict, responsive to a set of operating parameter values corresponding to operation of the electronic device, a power consumption value corresponding to the electronic device.

35. The method of claim 34, wherein the first step and the second step are performed by a processor integrated into a second electronic device.

36. A non-transitory computer readable medium storing instructions executable by a computer, the instructions comprising:
instructions that are executable by the computer to identify a subset of operating parameters of an electronic device that contributes most to power consumption of the electronic device by generating an initial model based on training data and by reducing the training data in the initial model, wherein the initial model comprises a plurality of basis functions and each of the plurality of basis functions corresponds to an operating parameter of the electronic device; and
instructions that are executable by the computer to generate a power model for the electronic device based on the reduced training data, wherein the power model is operable to predict, responsive to a set of operating parameter values corresponding to operation of the electronic device, a power consumption value corresponding to the electronic device.

37. The non-transitory computer readable tangible medium of claim 36, wherein the instructions are executable by at least one of: a communications device, a fixed location data unit, or a second computer.

* * * * *